(12) United States Patent
Trimberger (10) Patent No.: US 8,242,805 B1
(45) Date of Patent: Aug. 14, 2012

(54) METHOD AND APPARATUS FOR RESTRICTING THE USE OF INTEGRATED CIRCUITS

(75) Inventor: Stephen M. Trimberger, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/876,825

(22) Filed: Sep. 7, 2010

(51) Int. Cl.
*H03K 19/173* (2006.01)

(52) U.S. Cl. ............................ 326/38; 326/40; 326/41

(58) Field of Classification Search .................. None
See application file for complete search history.

(56) References Cited

U.S. PATENT DOCUMENTS

| | | | |
|---|---|---|---|
| 6,289,292 B1 * | 9/2001 | Charlton et al. ............... 702/108 |
| 7,143,295 B1 * | 11/2006 | Trimberger ................... 713/189 |
| 7,284,229 B1 | 10/2007 | Trimberger | |
| 7,286,020 B1 * | 10/2007 | O et al. ............................ 331/66 |
| 7,328,384 B1 | 2/2008 | Kulkarni et al. | |
| 7,339,400 B1 | 3/2008 | Walstrum, Jr. et al. | |
| 7,368,940 B1 * | 5/2008 | Schultz ........................... 326/38 |
| 7,710,147 B1 * | 5/2010 | White et al. .................... 326/38 |
| 8,022,724 B1 * | 9/2011 | Jenkins, IV .................... 326/38 |
| 2008/0172545 A1 * | 7/2008 | Boucard ....................... 711/221 |

OTHER PUBLICATIONS

U.S. Appl. No. 12/961,753, filed Dec. 7, 2010, Trimberger et al.

\* cited by examiner

*Primary Examiner* — Shawki S Ismail
*Assistant Examiner* — Crystal L Hammond
(74) *Attorney, Agent, or Firm* — LeRoy D. Maunu (57) ABSTRACT

In one embodiment, a method for restricting use of an integrated circuit (IC) is provided. A write-once memory of a programmable IC contains a first die-specific performance grade indicator. In response to receiving an input code having a second die-specific performance grade indicator with a value indicating a level of performance greater than or equal to a level of performance indicated by the first die-specific performance grade indicator, enabling operation of the IC. In response to receiving a configuration bitstream having the second die-specific performance grade indicator with a value indicating a level of performance less than a level of performance indicated by the first die-specific performance grade indicator, preventing operation of the IC.

20 Claims, 5 Drawing Sheets

METHOD AND APPARATUS FOR RESTRICTING THE USE OF INTEGRATED CIRCUITS

FIELD OF THE INVENTION

One or more embodiments of the invention generally relate to restricting the use of integrated circuits.

BACKGROUND

The minimum dimension that a given photolithography process can resolve is alternatively called the minimum feature size or the critical dimension. The feature size is a parameter of interest because reductions in the feature size tend to improve speed performance of the IC. The feature size of a printed integrated circuit (IC) is not uniform. The printing process results in slight variations of the feature size from lot to lot, from wafer to wafer, and from device to device within each wafer. As a result, programmable logic ICs, such as field programmable gate arrays (FPGAs), may experience variations in performance and functionality due to variations or defects resulting from the manufacturing process.

As circuit designs continue to place increased speed and power efficiency requirements on target devices, it is increasingly important for developers to simulate and test circuit designs on target devices using precise power and delay specifications prior to design realization. Due to the measured differences between devices caused by random variations between different dies, manufactured dies are often tested and assigned a performance grade value based on a number of performance grade factors such as speed/delay, operating temperature, operating voltage, power usage, etc. These factors may be guaranteed to designers. The tested die are typically sorted, packaged, and labeled according to one or more performance grades, allowing die capabilities to be closely matched to application requirements. In this manner, lower performing dies may be sold at a discounted price for non-demanding applications.

One concern is that the package of dies having a low performance grade, once purchased or otherwise acquired, may be relabeled to indicate a higher grade and wrongfully resold as legitimate packaged dies. Although some of these relabeled packaged dies may initially operate correctly, others may not. For applications having requirements exceeding the original performance grade rating, the relabeled dies will likely exhibit a higher failure rate and/or shorter lifespan than that guaranteed for legitimate dies—causing damage to the manufacturer's reputation.

The present invention may address one or more of the above issues.

SUMMARY

In one embodiment, a programmable integrated circuit (IC) is provided. The programmable IC includes a plurality of programmable resources, a non-volatile memory, and a configuration controller coupled to the programmable resources and to the non-volatile memory. The configuration controller is configured to receive a bitstream and compare a first die-specific performance grade value received in the bitstream to a second die-specific performance grade value read from the non-volatile memory. In response to a performance level indicated by the second die-specific performance grade value being equal to a performance level indicated by the first die-specific performance grade value, the configuration controller is configured to program the programmable resources with configuration data from the bitstream. In response to the performance level indicated by the second die-specific performance grade value being different from the performance level indicated by the first die-specific performance grade value, the configuration controller denies programming of the programmable resources with configuration data from the bitstream.

In another embodiment, the configuration controller is further configured to perform the programming of the programmable resources with configuration data from the bitstream step in response to the second die-specific performance grade value indicating a greater performance level than a performance level indicated by the first die-specific performance grade value. The denying of the programming is in response to the performance level indicated by the second die-specific performance grade value being less than the performance level indicated by the first die-specific performance grade value.

The non-volatile memory unit is write-once memory in another embodiment.

The second die-specific performance grade value, in another embodiment, includes a number of bits indicating a die-specific speed grade of the IC.

The second die-specific performance grade value includes a number of bits indicating a die-specific temperature rating of the IC in another embodiment.

In another embodiment, the second die-specific performance grade value includes a number of bits indicating a bitstream identification number.

The second die-specific performance grade value, in another embodiment, includes a number of bits indicating a customer identification number.

In another embodiment, the configuration controller circuit is further configured to determine a first cryptographic hash value from a portion of the bitstream including at least the minimum grade value and compare the first cryptographic hash value to a second cryptographic hash value specified in the bitstream. The programming of the configuration memory with the configuration data of the bitstream step is in response to the first and second cryptographic hash values being equal.

The configuration controller circuit is further configured to decrypt the bitstream with a decryption key stored in the non-volatile memory in another embodiment.

The non-volatile memory, in another embodiment, includes a limited access portion. In response to the limited access portion having an override bit set to an enabled value and a performance level indicated by the second die-specific performance grade value being less than a performance level indicated by the first die-specific performance grade value, the configuration controller circuit is further configured to program the configuration memory with the configuration data of the bitstream.

In another embodiment, a master control circuit is coupled to a control port of the programmable IC and to the non-volatile memory. The override bit of the limited access portion of the non-volatile memory is configurable to either the enabled value or a disabled value. The master control circuit is configured to set the override bit to the enabled value in response to a user command received on the control port.

In another embodiment, a method for restricting use of an integrated circuit IC is provided. In response to receiving an input code indicating a first die-specific performance grade indicator, a second die-specific performance grade indicator is retrieved from a write-once memory of the IC. In response to the second die-specific performance grade indicator having a value indicating a level of performance greater than or equal to a level of performance indicated by the first die-specific performance grade indicator, operation of the IC is enabled.

In response to the second die-specific performance grade indicator having a value indicating a level of performance less than a level of performance indicated by the first die-specific performance grade, operation of the IC is prevented.

The first die-specific performance grade indicator includes a die-specific speed grade of the IC in another embodiment.

The first die-specific performance grade indicator includes a die-specific temperature grade of the IC in another embodiment.

The IC, in another embodiment, is a programmable IC and the input code is a configuration bitstream.

In another embodiment, the enabling of operation of the IC includes programming a configuration memory of the programmable IC with the configuration bitstream. The preventing of operation of the IC includes preventing programming of the configuration memory of the programmable IC.

The first die-specific performance grade indicator includes a die-specific functionality grade of the programmable IC in another embodiment.

The first die-specific performance grade indicator includes a die-specific functionality grade identifying a bitstream that produces correct output when loaded on the programmable IC in another embodiment.

The programmable IC, in another embodiment, includes one or more programmable resources that are not required by the bitstream for correct output and are not verified to be free of defects.

In response to a user command, a selected value is stored in the write-once memory in another embodiment. In response to the selected value being stored in the write-once memory and receiving a configuration bitstream, configuration memory of the programmable IC is programmed with the configuration bitstream.

In another embodiment, an integrated circuit (IC) is provided. The IC includes a non-volatile memory, processing resources and a controller circuit. The controller circuit is coupled to the processing resources and to the non-volatile memory and is configured to, in response to input data indicating a first die-specific performance grade value, retrieve a second die specific performance grade value from the non-volatile memory. In response to a performance level indicated by the second die-specific performance grade value being greater than or equal to a performance level indicated by the first die-specific performance grade value, the controller circuit is configured to enable operation of the processing resources of the IC. In response to the performance level indicated by the second die-specific performance grade value being less than the performance level indicated by the first die-specific performance grade value, the controller circuit is configured to prevent operation of the processing resources of the IC.

An integrated circuit (IC), in another embodiment, comprises a non-volatile memory, a processor, and a program memory. The processor is configured, in response to executing one or more instructions from the program memory and input data indicating a first die-specific performance grade value, to perform operations including retrieving a second die-specific performance grade value from the non-volatile memory. The operations further include continuing execution of instructions from the program memory in response to a performance level indicated by the second die-specific performance grade value being greater than or equal to a performance level indicated by the first die-specific performance grade value. If the performance level indicated by the second die-specific performance grade value is less than the performance level indicated by the first die-specific performance grade value, the processor halts execution of instructions from the program.

In another embodiment, a method of making a programmable IC is provided. A configuration control circuit is formed on an integrated circuit having a plurality of programmable resources, a configuration memory, and a write-once memory unit. A die-specific performance level of the programmable IC is determined. A first die-specific performance grade value indicative of the die-specific performance level is stored in the write-once memory unit. In response to an input configuration bitstream, the configuration control circuit is configured to compare a second die-specific performance grade value contained in the bitstream with the first die-specific performance grade value stored in the write-once memory. In response to a performance level indicated by the first die-specific performance grade value being equal to a performance level indicated by the second die-specific performance grade value, the configuration memory is programmed with the configuration bitstream. In response to the performance level indicated by the first die-specific performance grade value being different from the performance level indicated by the second die-specific performance grade value, programming of the configuration memory with the configuration bitstream is prevented.

In another embodiment, the configuration control circuit is configured to program the configuration memory with the configuration bitstream in response to the performance level indicated by the first die-specific performance grade value being greater than the performance level indicated by the second die-specific performance grade value. The configuration control circuit is configured to prevent the programming of the configuration memory with the configuration bitstream in response to the performance level indicated by the first die-specific performance grade value being less than the performance level indicated by the second die-specific performance grade value.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION

Due to the measured differences between devices caused by random variations from die to die, manufactured dies are often tested to determine a number of performance factors such as speed/delay, operating temperature, operating voltage, power usage, etc. Developers use these indicated factors to determine whether a programmable integrated circuit (IC) meets the requirements of a circuit design. Programmable IC dies may be sorted and labeled to indicate various performance ratings or functional features. Dies having the higher performance rating or more functional features are typically sold for a higher value. Many ICs are susceptible to counterfeit re-labeling, which may involve changing an indicated die-specific performance grading to fraudulently indicate a more desirable die. The resulting counterfeited packaged dies may not perform as would be expected and, as a result, the reputation and business of a manufacturer may suffer. The embodiments described herein provide circuits and methods to restrict the use of a programmable IC die to prevent counterfeit re-labeling of low-grade devices.

In one embodiment, value(s) indicating one or more die-specific performance grades may be stored in a non-volatile memory of a programmable IC die. A bitstream may be configured to indicate one or more required performance grades. The programmable IC die is configured to prevent configuration of the programmable IC if an input bitstream indicates a required performance grade that cannot be met by the die-specific performance grade stored in the non-volatile memory of the programmable IC die. The non-volatile memory should be configured to prevent users from changing a stored low performance grade to a higher performance grade. In one implementation, the non-volatile memory may be a write once memory such as electronic fuse memory. In one implementation, write access to the non-volatile memory may be disabled by the manufacturer after storing the die-specific performance grade. The performance grading may be implemented such that writing bits to the fuse memory by a user results in a less desirable performance grade. In another implementation, the non-volatile memory may be externally inaccessible to customers and the general public. In this implementation, the programmable IC can be configured to only allow modification to the non-volatile memory after receiving a secret command known only to the manufacturer. One skilled in the art will recognize that a number of other methods may also be used to limit user access to the non-volatile memory.

Figure 1:
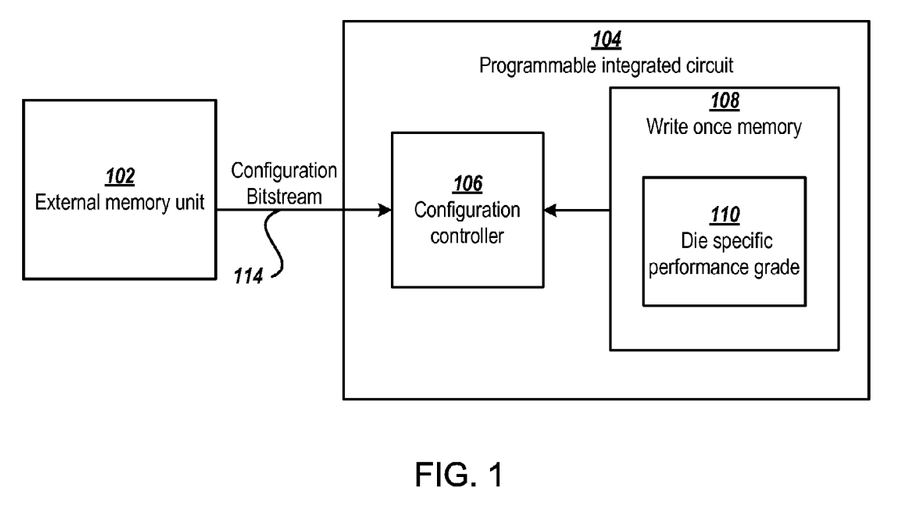
FIG. 1 shows a block diagram of an example programmable integrated circuit configured in accordance with one embodiment.

FIG. 1 shows a block diagram of an example programmable integrated circuit configured in accordance with one embodiment. The programmable IC 104 includes a configuration controller 106 configured to receive a configuration bitstream 114 from external memory unit 102, determine hardware requirements of the configuration bitstream, and, in response to determining the programmable IC 104 meets the requirements of the bitstream, program the programmable IC 104 with the configuration bitstream.

After manufacturing, dies can be tested to determine one or more performance factors. For example, each die may be tested to determine a delay value corresponding to the switching speed of transistors within the die. Measurements may be obtained by probing each die following assembly to determine delay values. In programmable integrated circuits, measurements may also be obtained by configuring several logic blocks to implement built-in-self-test (BIST) ring oscillators that depend on the logic block delay called TILO. These ring oscillators are commonly called TILO rings. When operated, the switching speed of transistors implementing the TILO rings can be determined from the frequency at which the TILO rings oscillate. One skilled in the art will recognize that a number of other methods may be used to determine delay parameters, as well as other performance factors. A speed performance grade corresponding to the determined delay value can be assigned to the die and stored in write-once memory unit 108.

A bitstream of a circuit design may then be configured to require one or more die-specific performance grades. When a configuration bitstream 114 is received, the configuration controller 106 determines if one or more performance grades are specified by the configuration bitstream 114. If a certain performance grade is required, the configuration controller 106 retrieves one or more corresponding die-specific performance grades (grade values) 110 from write once memory 108 of the programmable IC 104. If the die-specific performance grade 110 meets the requirement of the performance grade indicated by the bitstream 114, the configuration controller programs the IC with configuration data contained in the bitstream.

One skilled in the art will recognize that the embodiments described herein are not limited to programmable ICs, but may be incorporated into a number of integrated circuits, including but not limited to system-on-chip ICs, microprocessors, and processors. For example, a system-on-chip IC may include a controller circuit and a non-volatile memory. The controller circuit may be configured to disable operation of the IC if a device-specific performance grade stored in the non-volatile memory does not meet the requirements of a program to be executed by the IC.

For a microprocessor or processor embodiment, the processor executes instructions from a program memory. In response to executing one or more instructions from the program memory and input data indicating a first die-specific performance grade value, the processor retrieves a second die-specific performance grade value from the non-volatile memory. The processor compares the first die-specific performance grade value to the second die-specific performance grade value. If the performance level indicated by the second die-specific performance grade value is greater than or equal to a performance level indicated by the first die-specific performance grade value, the processor continues execution of instructions from the program memory. If the performance level indicated by the second die-specific performance grade value is less than the performance level indicated by the first die-specific performance grade value, the processor halts execution of instructions from the program memory.

Figure 2:
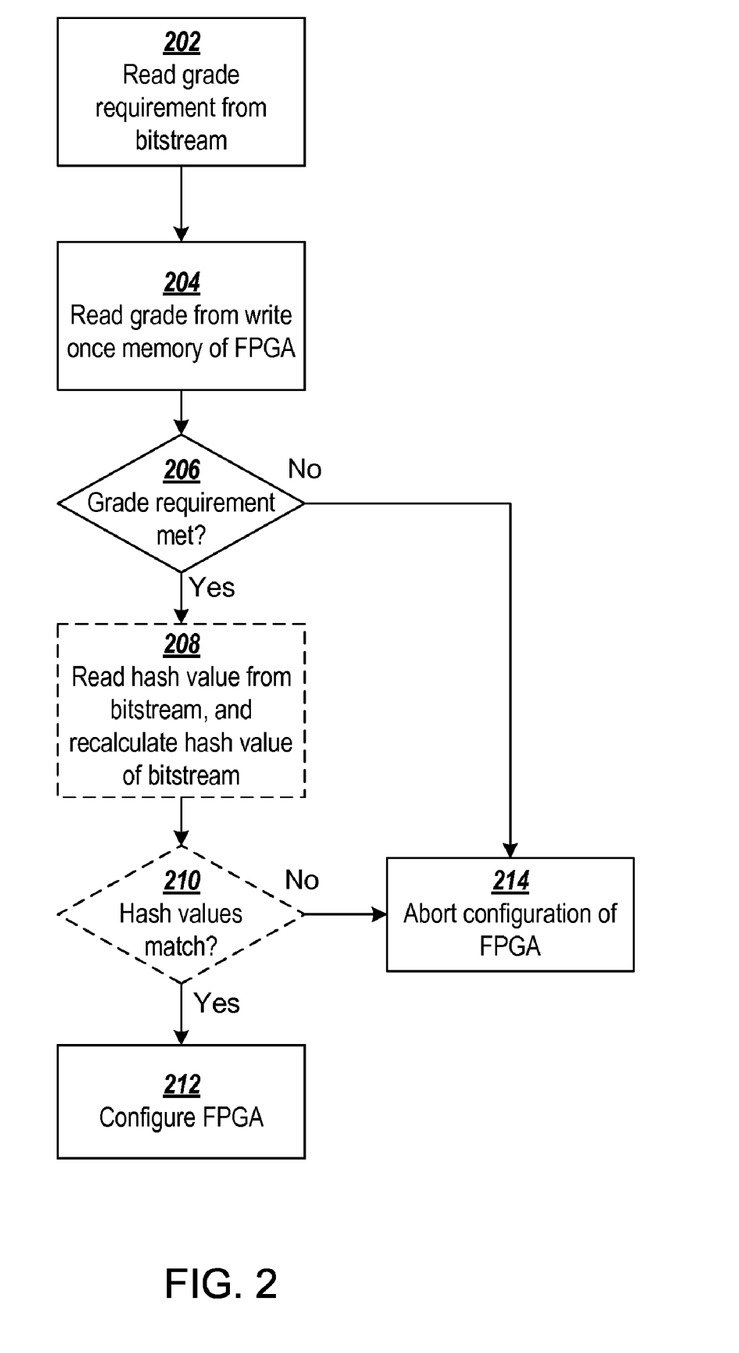
FIG. 2 shows a flowchart of an example process for configuration of a programmable integrated circuit in accordance with one embodiment.

FIG. 2 shows a flowchart of an example process for configuration of a programmable integrated circuit in accordance with one embodiment. A performance grade requirement is retrieved from a bitstream at process block 202. A die-specific performance grade of a programmable IC is retrieved from a write-once memory of the IC at process block 204. If the performance grade requirement retrieved from the bitstream is met by the die-specific performance grade retrieved from the write-once memory (decision block 206), the programmable IC is configured at process block 212. If the performance grade requirement is not met by the die-specific performance grade retrieved from the write-once memory (decision block 206), configuration of the programmable IC is aborted at process block 214.

In addition to variations in performance from die to die, programmable ICs may include manufacturing defects. A defect too small to see can render an IC completely or partially nonfunctional. As feature sizes continue to decrease, tiny defects are becoming more and more likely to impinge on active logic of a die. Another important trend is a rapid increase in die size. As transistor count increases, the likelihood of a given die including a defect increases dramatically. The problem of low yield has significant economic impact on programmable integrated circuit manufacturers. There are two types of defects: gross defects (which cause the failure of an entire die) and localized defects (which cause the failure of small portions of a die's circuitry). Partially defective dies may still be utilized where defects are limited to an isolated function. For example, an FPGA provider can sort and label package dies to distinguish those in which only the block RAM is defective from fully operational FPGAs. If a user design does not use the block RAM, the design will still function correctly when implemented in one of these FPGAs. The FPGA provider can sell these partially defective devices to a customer at a reduced price, as an alternative to discarding them.

In FPGAs, for example, many defects may occur in the programmable logic that can occupy a majority of the die. When a circuit design is implemented, the location of a defect in the programmable logic is generally unknown and may be different for each partially defective die. To avoid incorrect operation of circuit designs implemented in the programmable logic, manufacturers generally discard programmable IC dies containing any defects that affect the active logic. As a result, the product yield may be decreased significantly.

However, where the circuit design to be loaded onto the programmable logic is known to the manufacturer, components of the programmable IC die not utilized by the design do not need to be tested, because they will not affect operation of the circuit design. Because the number of tested components is reduced, production yield of operational devices increases. Due to the increase in production yield, companies may offer discounts to customers for programmable IC dies guaranteed to operate for specific circuit designs.

Because unutilized components have not been verified, they may not be operational and may cause incorrect operation if the device is configured with an untested circuit design. In accordance with one embodiment, programmable IC dies verified and sold for use with specific bitstreams are marked by storing one or more bits in the write-once memory of the device die.

Referring to FIG. 2, a bitstream-specific identifier may be stored in the write-once memory of the device die to restrict the use of the programmable IC die to a specific bitstream, which may be indicated by the grade requirement determined in process block 202. A person may attempt to circumvent this restriction by modifying the authorized bitstream to include a different circuit design. This type of circumvention may be prevented by verifying the integrity of the bitstream at process blocks 208-210 prior to configuration. In this example implementation, the integrity of the bitstream is verified with a cryptographic hash. A hash value is computed from the bitstream at process block 208 and compared to an expected hash value stored in the bitstream. If the hash values match at decision block 210, the programmable IC is configured at process block 212. Otherwise, configuration of the programmable IC is aborted at process block 214.

One skilled in the art will recognize that there are several other situations in which a manufacturer may wish to restrict the use of programmable IC dies. For example, in some situations, a customer may wish to purchase a large quantity of devices for an application for which a low grade device is suitable. To satisfy the order, a manufacturer may devalue high-grade devices by labeling them as a lower grade. It would be desirable to prevent the customer from reselling these devices or using these devices for applications other than those that were authorized under contract or license. In one embodiment, each die may be configured with a number to restrict the operation of the programmable IC to a specified bitstream as described above.

In another embodiment, the die may be configured to restrict configuration of the programmable IC to bitstreams indicating a particular customer-specific identifier. The customer-specific identifier may be controlled in a number of ways to enable customers to create authorized bitstreams with the customer's identifier, while preventing others from using the authorized customer's customer-specific identifier. For example, a bitstream generation software tool may be distributed to a customer to generate bitstreams from their designs. The software may be configured with the customer-specific identification number hidden from customer view. In another implementation, the software may be configured to retrieve the identification number from a hardware dongle distributed to authorized customers. In yet another embodiment, the software may be configured to request the customer-specific identification number from a server maintained by the manufacturer.

In one embodiment, packaged dies that have been downgraded or restricted in another manner may be reconfigured to bypass limitations previously placed on the packaged die. For example, a manufacturer may restrict a number of fully functional packaged dies to a specific bitstream for a customer. If unused, the customer may wish to return an excess number of the packaged dies for a refund or credit at a later time. However, if these packaged dies are restricted to the single bitstream they would not likely be useful to another customer. In this embodiment, the restriction can be bypassed by the manufacturer, allowing the previously restricted packaged dies to be resold. For example, in one implementation, the programmable IC is configured with write-once memory that includes one or more externally inaccessible bits. The externally inaccessible bits can be used to store a value indicating that one or more restrictions stored in the write-once memory are to be ignored during startup of the device. The programmable IC 104 of FIG. 1 may include a master control circuit (not shown), coupled to a control port of the programmable IC and to a non-volatile memory. The master control circuit is configured to only allow the externally inaccessible bits to be modified after receiving a secret command known only to the manufacturer. One skilled in the art will recognize that a number of other methods may also be used to allow the manufacturer to bypass restrictions, depending on the manner in which the memory used to store performance grades is implemented.

Figure 3:
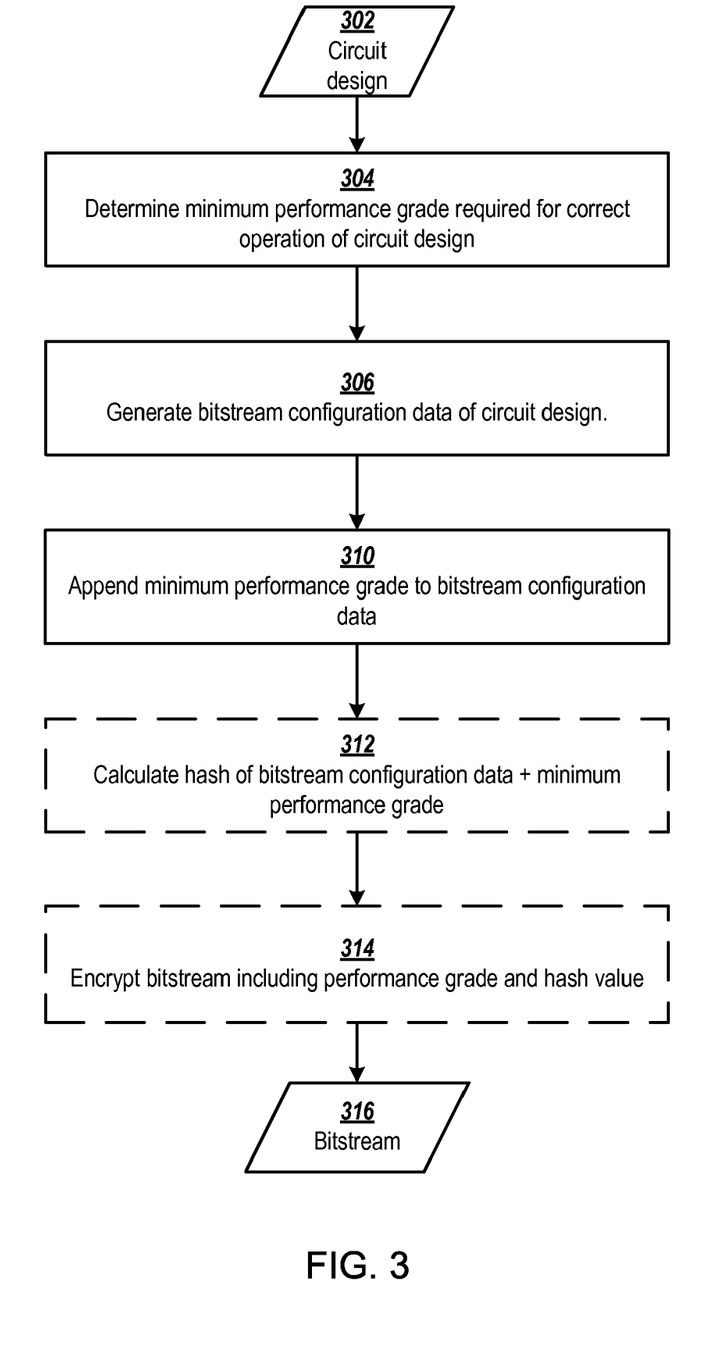
FIG. 3 shows a flowchart of an example process for generation of a bitstream for restricted operation of a programmable integrated circuit in accordance with one embodiment.

FIG. 3 shows a flowchart of an example process for generation of a bitstream for restricted operation of a programmable integrated circuit in accordance with one embodiment.

A circuit design 302 is received and analyzed to determine a minimum performance grade required for correct operation of the circuit design at process block 304. In some implementations, analysis includes simulating the circuit design to determine a minimum performance grade required to operate the circuit design on the target architecture. A bitstream of the circuit design is generated at process block 306. In this example, the performance grade determined at process block 306 is appended to the generated bitstream at process block 310, resulting in bitstream 316. In applications in which verification of the bitstream is required, as shown in process blocks 208-210 of FIG. 2, a hash value of the bitstream including the performance grade is calculated at process block 312. In this example, the bitstream, performance grade, and hash are encrypted at process block 314, resulting in bitstream 316.

Figure 4:
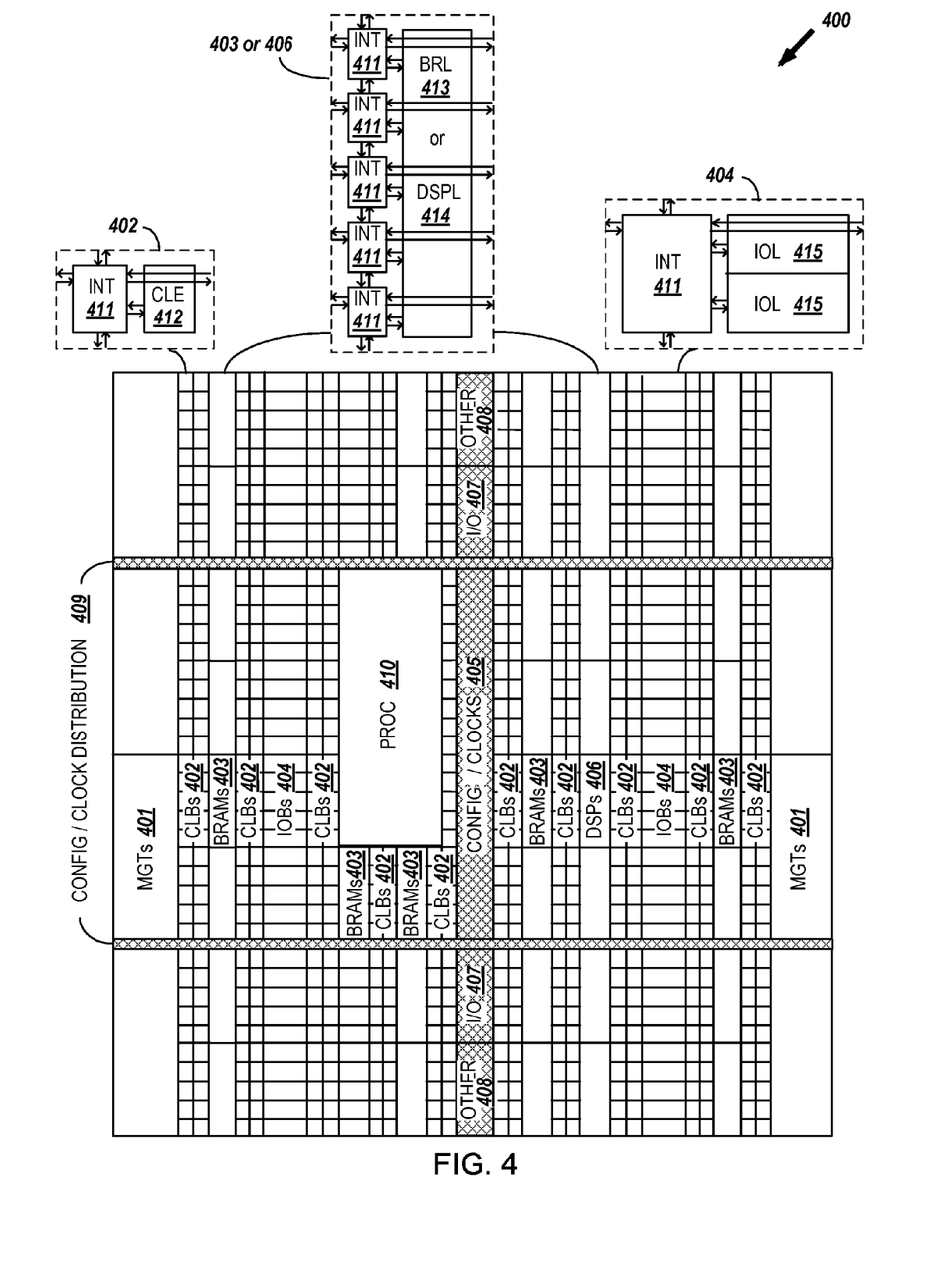
FIG. 4 illustrates a block diagram of a programmable integrated circuit for implementing a circuit design with programmable operating voltage in accordance with various embodiments.

FIG. 4 is a block diagram of an example programmable integrated circuit that may be used as a target device in accordance with many of the various embodiments described herein. FPGAs can include several different types of programmable logic blocks in the array. For example, FIG. 4 illustrates an FPGA architecture (400) that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407), for example, e.g., clock ports, and other programmable logic 408 such as digital clock managers, analog-to-digital converters, system monitoring logic, and so forth. Some FPGAs also include dedicated processor blocks (PROC 410) and internal and external reconfiguration ports (not shown).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

Figure 5:
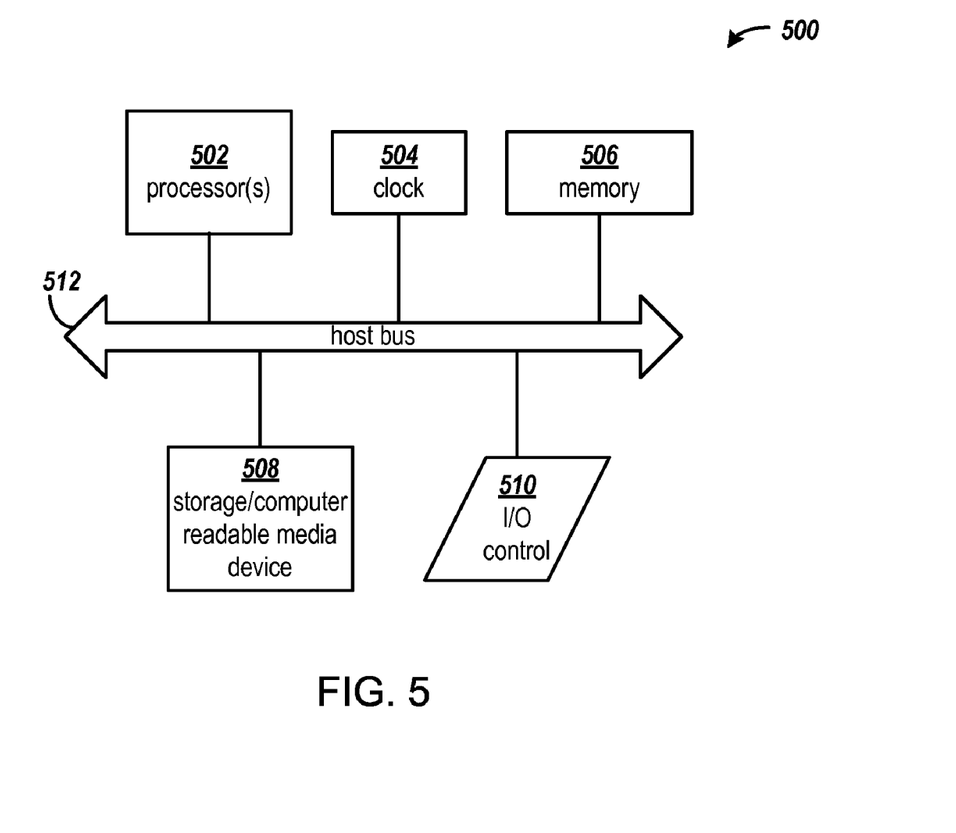
FIG. 5 illustrates a block diagram of a general purpose processor computing arrangement suitable for implementing the processes described herein.

FIG. 5 is a block diagram of an example computing arrangement which may be configured to specifically perform the processes described herein using a general purpose processor. Those skilled in the art will appreciate that various alternative computing arrangements, including one or more processors and a memory arrangement configured with program code, would be suitable for hosting the processes and data structures and implementing the methods described herein. The computer code, comprising the processes described herein encoded in a processor executable format, may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory unit 506, a storage unit 508, and an input/output control unit 510 coupled to host bus 512. The arrangement 500 may be implemented with separate components on a circuit board or may be implemented internally within an integrated circuit as a system-on-chip. When implemented internally within an integrated circuit, the processor computing arrangement is otherwise known as a microcontroller.

The architecture of the computing arrangement depends on implementation requirements as would be recognized by those skilled in the art. The processor 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory and a main memory. The storage arrangement 508 may include local and/or remote persistent storage such as provided by magnetic disks (not shown), flash, EPROM, or other non-volatile data storage. The storage unit may be read or read/write capable. Further, the memory 506 and storage 508 may be combined in a single arrangement.

The processor arrangement 502 executes the software in storage 508 and/or memory 506 arrangements, reads data from and stores data to the storage 508 and/or memory 506 arrangements, and communicates with external devices through the input/output control arrangement 510. These functions are synchronized by the clock signal generator 504. The resource of the computing arrangement may be managed by either an operating system (not shown), or a hardware control unit (not shown).

The one or more embodiments are thought to be applicable to a variety of performance guarantee data formats indicating parameters for a variety of devices and integrated circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable integrated circuit (IC), comprising:
a plurality of programmable resources;
a non-volatile memory; and
a configuration controller coupled to the programmable resources and to the non-volatile memory, the configuration controller configured to perform steps of:
receiving a bitstream;
comparing a first die-specific performance grade value received in the bitstream to a second die-specific performance grade value read from the non-volatile memory;

in response to a performance level indicated by the second die-specific performance grade value being equal to a performance level indicated by the first die-specific performance grade value, programming the programmable resources with configuration data from the bitstream; and in response to a performance level indicated by the second die-specific performance grade value being different from the performance level indicated by the first die-specific performance grade value, aborting programming of the programmable resources with the bitstream.

2. The programmable IC of claim 1, wherein:
the configuration controller is further configured to perform the programming of the programmable resources with configuration data from the bitstream step in response to the second die-specific performance grade value indicating a greater performance level than a performance level indicated by the first die-specific performance grade value; and the denying of the programming is in response to the performance level indicated by the second die-specific performance grade value being less than the performance level indicated by the first die-specific performance grade value.

3. The programmable IC of claim 1, wherein the non-volatile memory unit is write-once memory.

4. The programmable IC of claim 1, wherein the second die-specific performance grade value includes a number of bits indicating a die-specific speed grade of the IC.

5. The programmable IC of claim 1, wherein the second die-specific performance grade value includes a number of bits indicating a die-specific temperature rating of the IC.

6. The programmable IC of claim 1, wherein the second die-specific performance grade value includes a number of bits indicating a bitstream identification number.

7. The programmable IC of claim 1, wherein the second die-specific performance grade value includes a number of bits indicating a customer identification number.

8. The programmable IC of claim 1, wherein:
the configuration controller circuit is further configured to:
determine a first cryptographic hash value from a portion of the bitstream including at least the minimum grade value; and
compare the first cryptographic hash value to a second cryptographic hash value specified in the bitstream; and
the programming of the configuration memory with the configuration data of the bitstream step is conditional on the first and second cryptographic hash values being equal.

9. The programmable IC of claim 1, wherein the configuration controller circuit is further configured to decrypt the bitstream with a decryption key stored in the non-volatile memory.

10. The programmable IC of claim 1, wherein:
the non-volatile memory includes a limited access portion; and
the configuration controller circuit is further configured to program, in response to the limited access portion having an override bit set to an enabled value and a performance level indicated by the second die-specific performance grade value being less than a performance level indicated by the first die-specific performance grade value, the configuration memory with the configuration data of the bitstream.

11. The programmable IC of claim 10, further comprising:
a master control circuit coupled to a control port of the programmable IC and to the non-volatile memory;
wherein the override bit of the limited access portion of the non-volatile memory is configurable to either the enabled value or a disabled value; and
wherein the master control circuit is configured to set the override bit to the enabled value in response to a user command received on the control port.

12. A method for restricting the use of an integrated circuit (IC), comprising:
in response to receiving an input code indicating a first die-specific performance grade indicator, performing steps including:
retrieving a second die-specific performance grade indicator from a write-once memory of the IC;
in response to the second die-specific performance grade indicator having a value indicating a level of performance greater than or equal to a level of performance indicated by the first die-specific performance grade indicator, enabling operation of the IC; and
in response to the second die-specific performance grade indicator having a value indicating a level of performance less than a level of performance indicated by the first die-specific performance grade, preventing operation of the IC.

13. The method of claim 12, wherein the second die-specific performance grade indicator includes a die-specific speed grade of the IC.

14. The method of claim 12, wherein the second die-specific performance grade indicator includes a die-specific temperature grade of the IC.

15. The method of claim 12, wherein:
the IC is a programmable IC;
the input code is a configuration bitstream.

16. The method of claim 15, wherein:
the enabling operation of the IC includes programming a configuration memory of the programmable IC with the configuration bitstream; and
the preventing operation of the IC includes preventing programming of the configuration memory of the programmable IC.

17. The method of claim 15, wherein the second die-specific performance grade indicator includes a die-specific functionality grade of the programmable IC.

18. The method of claim 17, wherein:
the second die-specific performance grade indicator includes a die-specific functionality grade identifying a bitstream that produces correct output when loaded on the programmable IC; and
the programmable IC includes one or more programmable resources that are not required by the bitstream for correct output and are not verified to be free of defects.

19. The method of claim 12, further comprising:
in response to a user command, storing a selected value in the write-once memory; and
in response to the selected value being stored in the write-once memory and receiving input code indicating a die-specific performance grade indicator, enabling operation of the IC with the configuration bitstream.

20. An integrated circuit (IC), comprising:
a non-volatile memory;
a processor coupled to the non-volatile memory; and
a program memory coupled to the processor;
wherein the processor is configured, in response to executing one or more instructions from the program memory and input data indicating a first die-specific performance grade value, to perform operations including:

retrieving a second die-specific performance grade value from the non-volatile memory;

continuing execution of instructions from the program memory in response to a performance level indicated by the second die-specific performance grade value being greater than or equal to a performance level indicated by the first die-specific performance grade value; and halting execution of instructions from the program memory in response to the performance level indicated by the second die-specific performance grade value being less than the performance level indicated by the first die-specific performance grade value.

* * * * *